(12) United States Patent  
Jansen et al.

(10) Patent No.: US 12,117,739 B2  
(45) Date of Patent: Oct. 15, 2024

(54) THERMO-MECHANICAL ACTUATOR

(71) Applicant: ASML Netherlands B.V., Veldhoven (NL)

(72) Inventors: Bas Jansen, Den Bosch (NL); Koen Martin Willem Jan Bos, Eindhoven (NL); Johannes Petrus Martinus Bernardus Vermeulen, Leende (NL)

(73) Assignee: ASML Netherlands B.V., Veldhoven (NL)

( * ) Notice: Subject to any disclaimer, the term of this patent is extended or adjusted under 35 U.S.C. 154(b) by 131 days.

(21) Appl. No.: 17/629,202

(22) PCT Filed: Jun. 30, 2020

(86) PCT No.: PCT/EP2020/068432  
§ 371 (c)(1),  
(2) Date: Jan. 21, 2022

(87) PCT Pub. No.: WO2021/018499  
PCT Pub. Date: Feb. 4, 2021

(65) Prior Publication Data  
US 2022/0236651 A1    Jul. 28, 2022

(30) Foreign Application Priority Data

Jul. 29, 2019  (EP) ..................... 19188866

(51) Int. Cl.  
*G03F 7/00* (2006.01)  
*H02N 2/00* (2006.01)  
(Continued)

(52) U.S. Cl.  
CPC ...... *G03F 7/70783* (2013.01); *G03F 7/70266* (2013.01); *G03F 7/70716* (2013.01);  
(Continued)

(58) Field of Classification Search  
CPC .. G03F 7/70266; G03F 7/707; G03F 7/70716; G03F 7/70783; G03F 7/7085;  
(Continued)

(56) References Cited

U.S. PATENT DOCUMENTS 6,020,964 A    2/2000  Loopstra et al.  
6,333,586 B1   12/2001 Polach et al.  
(Continued)

FOREIGN PATENT DOCUMENTS

CN    106646856 A    5/2017  
DE      3809284 A1    9/1989  
(Continued)

OTHER PUBLICATIONS

International Search Report and Written Opinion of the International Searching Authority directed to related International Patent Application No. PCT/EP2020/068432, mailed Oct. 10, 2020; 17 pages.

(Continued)

*Primary Examiner* — Deoram Persaud  
(74) *Attorney, Agent, or Firm* — Sterne, Kessler, Goldstein & Fox P.L.L.C.

(57) ABSTRACT

Disclosed is a thermo-mechanical actuator (100) comprising a piezo-electric module (110), the piezo-electric module comprising at least one piezo-electric element (120), wherein the thermo-mechanical actuator is configured to: •o receive a thermal actuation signal (132) for controlling a thermal behaviour of the piezo-electric module, or •o provide a thermal sensing signal (132) representative of a thermal state of the piezo-electric module, and, wherein the thermo-mechanical actuator is configured to: •o receive a mechanical actuation (134) signal for controlling a mechanical behaviour of the piezo-electric module, or •o provide a (Continued)

mechanical sensing signal (134) representative of a mechanical state of the piezo-electric module.

20 Claims, 10 Drawing Sheets

(51) Int. Cl.
*H02N 2/02* (2006.01)
*H02N 2/06* (2006.01)

(52) U.S. Cl.
CPC ......... *G03F 7/70891* (2013.01); *H02N 2/009* (2013.01); *H02N 2/028* (2013.01); *H02N 2/062* (2013.01)

(58) Field of Classification Search
CPC . G03F 7/70875; G03F 7/70891; H02N 2/009; H02N 2/028; H02N 2/062; H10N 15/10; H10N 30/1071; H10N 30/20; H10N 30/302; H10N 30/802
See application file for complete search history.

(56) References Cited

U.S. PATENT DOCUMENTS

| | | | |
|---|---|---|---|
| 6,952,253 B2 | 10/2005 | Lof et al. | |
| 11,187,990 B2 | 11/2021 | Lippert et al. | |
| 2002/0175597 A1 | 11/2002 | Raman et al. | |
| 2006/0146655 A1 | 7/2006 | Meinders | |
| 2007/0058173 A1 | 3/2007 | Holzapfel | |
| 2008/0239503 A1* | 10/2008 | Conradi | G03F 7/70825 359/666 |
| 2010/0033704 A1 | 2/2010 | Shiraishi | |
| 2010/0060109 A1 | 3/2010 | Russell et al. | |
| 2010/0141914 A1 | 6/2010 | Gilissen et al. | |
| 2013/0335722 A1 | 12/2013 | Aangenent et al. | |
| 2016/0209273 A1 | 7/2016 | Kubo et al. | |
| 2016/0268931 A1 | 9/2016 | Aliane et al. | |
| 2016/0269931 A1 | 9/2016 | Dinan | |
| 2022/0214626 A1* | 7/2022 | Frencken | G03F 7/7075 |

FOREIGN PATENT DOCUMENTS

| | | |
|---|---|---|
| JP | H05206535 A | 8/1993 |
| JP | 2002100551 A | 4/2002 |
| JP | 2006-124189 A | 5/2006 |
| JP | 2007-519132 A | 7/2007 |
| JP | 2010-114986 A | 5/2010 |
| KR | 1020210040045 A | 4/2021 |
| TW | 201624143 A | 7/2016 |
| WO | WO 2015/072095 A1 | 5/2015 |
| WO | WO 2016/050507 A1 | 4/2016 |
| WO | WO 2018/024416 A1 | 2/2018 |

OTHER PUBLICATIONS

International Preliminary Report on Patentability directed to related International Patent Application No. PCT/EP2020/068432, issued Feb. 1, 2022; 13 pages.
Ursic H et al: "Multifunctional Piezoelectric and Electrocaloric Self-standing Thick Films", Proceedings of the 48TH International Conference on Microelectronics, Devices and Materials & The Workshop on Ceramic Microsystems, Sep. 19-21, 2012 Electronic Components and Materials, Otocec, Slovenia, Jan. 1, 2012 (Jan. 1, 2012), pp. 321-325, XP009523070, ISBN: 978-961-92933-2-4.
W P Cao et al: "Enhanced electrical properties in lead-free NBT-BT ceramics by series ST substitution", Ceramics International, vol. 42, Feb. 12, 2016 (Feb. 12, 2016), pp. 8438-8444, XP055733673, DOI: 10.1016/j.ceramint.2016.02.063.

* cited by examiner

THERMO-MECHANICAL ACTUATOR

CROSS-REFERENCE TO RELATED APPLICATION

The application claims priority of EP application 19188866.8 which was filed on Jul. 29, 2019 and which is incorporated herein in its entirety by reference.

FIELD

The present invention relates to a thermo-mechanical actuator and an assembly comprising a component for a lithographic apparatus and a thermo-mechanical actuator.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In order to keep up with the ever increasing demand to scale down the dimensions of circuit elements, a more accurate control of the patterning process may be desired or is required. In particular, it may be desired to better control a position of the substrate during the patterning process or to better control a temperature of the substrate during the patterning process. Similarly, it may be desirable to better control a shape or position or temperature of optical elements that are used to generate the patterned beam of radiation that is projected onto the substrate.

SUMMARY

It is an objective of the present invention to enable an improved control, in particular an improved thermal and mechanical control, of a component such as a component of a lithographic apparatus or a component used in a lithographic apparatus.

According to an aspect of the present invention, there is provided a thermo-mechanical actuator comprising a piezo-electric module, the piezo-electric module comprising at least one piezo-electric element, wherein the thermo-mechanical actuator is configured to:
- o receive a thermal actuation signal for controlling a thermal behaviour of the piezo-electric module, or
- o provide a thermal sensing signal representative of a thermal state of the piezo-electric module, and, wherein the thermo-mechanical actuator is configured to:
- o receive a mechanical actuation signal for controlling a mechanical behaviour of the piezo-electric module, or
- o provide a mechanical sensing signal representative of a mechanical state of the piezo-electric module, and wherein the thermal actuation signal is configured to create a heat flux within the piezo-electric module and wherein the mechanical actuation signal is configured to deform the piezo-electric module.

According to another aspect of the present invention, there is provided an assembly comprising:
- o a component for a lithographic apparatus, and
- o a thermo-mechanical actuator according to the present invention, wherein the thermo-mechanical actuator is configured to control a thermal behaviour and mechanical behaviour of the component.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
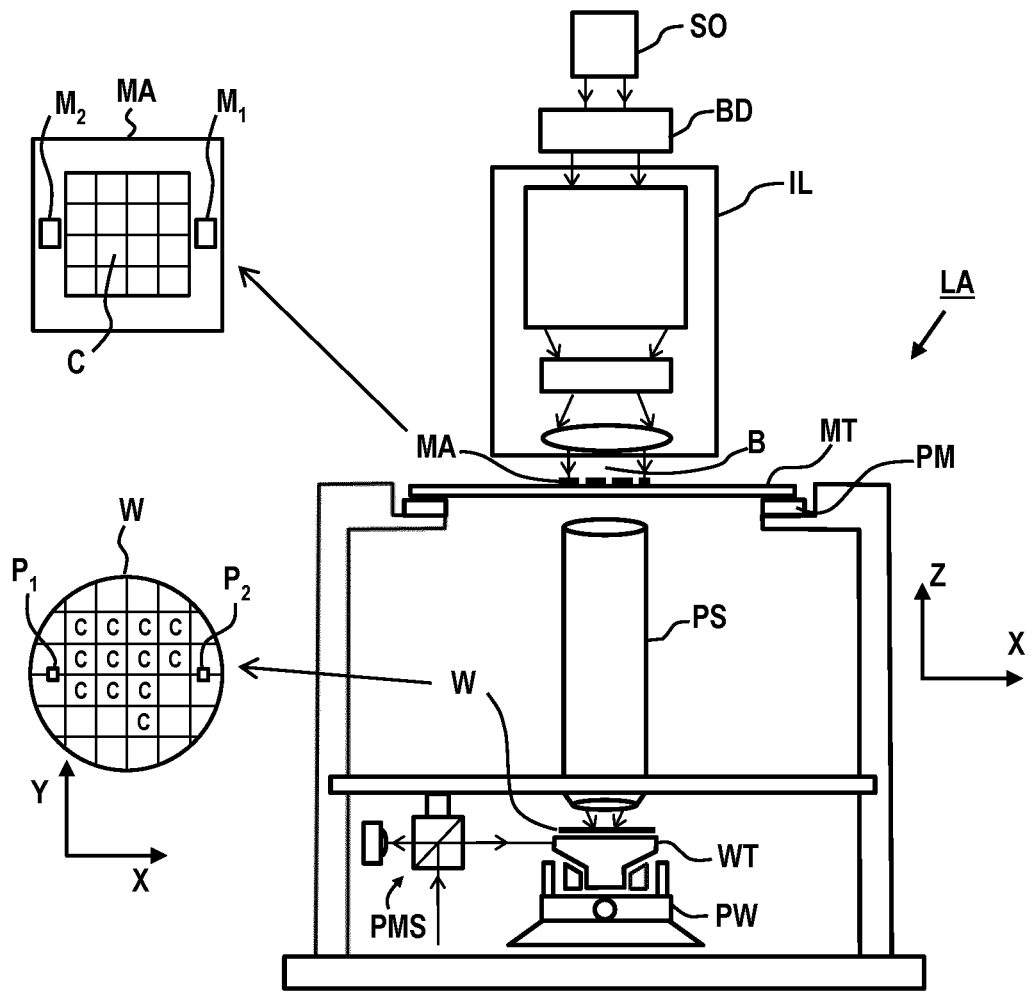
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
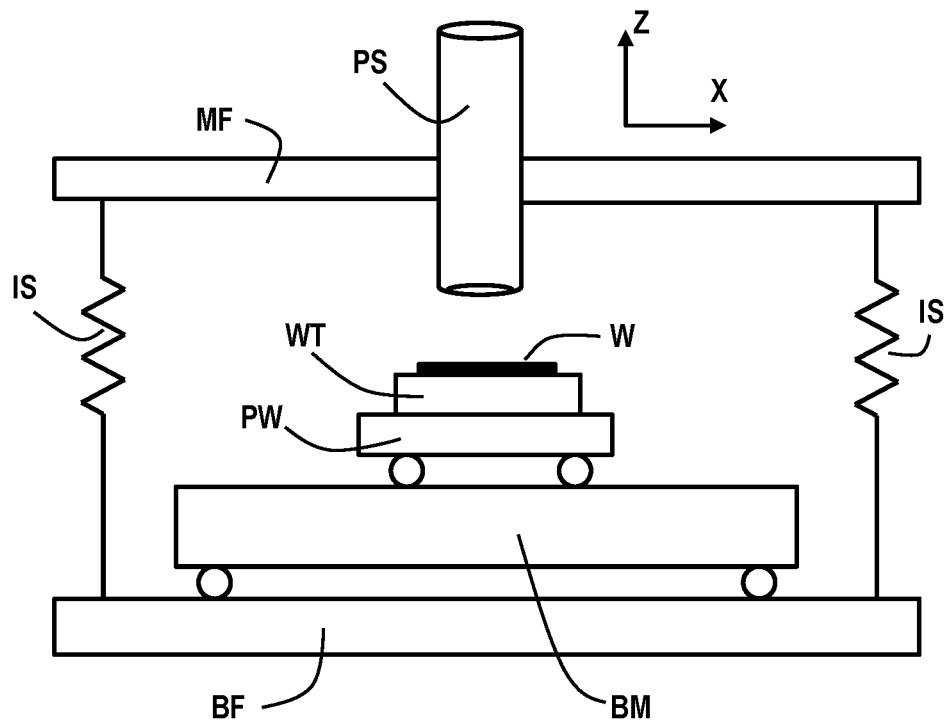
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
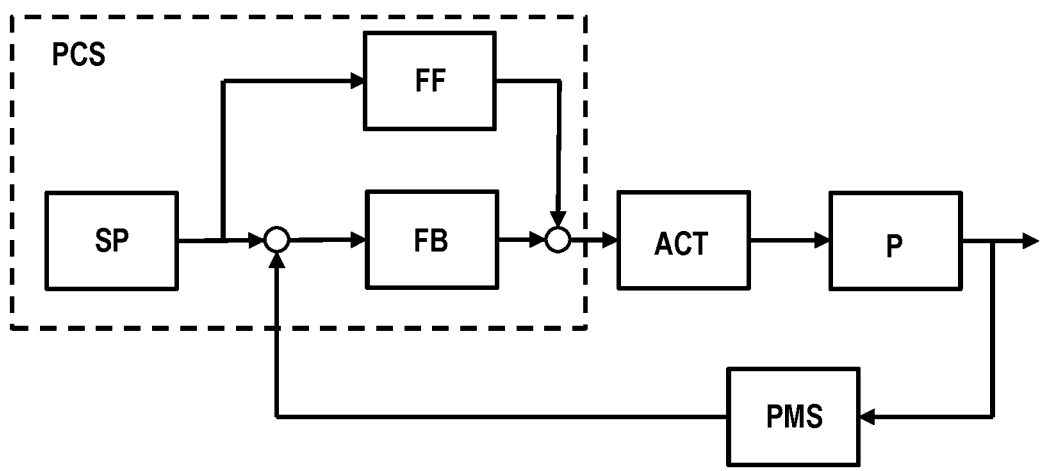
FIGS. 3(a)-3(e) schematically depict a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

In order to accurately perform the patterning process or exposure process, it is required that the patterned radiation beam is accurately positioned relative to the substrate, said substrate e.g. comprising a previously patterned layer. In order to ensure proper operation of the semiconductor device or circuit, an accurate alignment of the patterned radiation beam and the previously patterned layer is required. Such an accurate alignment may e.g. require an accurate positioning of the substrate in an xy-plane substantially parallel to the main surface of the substrate. Within the meaning of the present invention, x-axis and y-axis are defined as two substantially perpendicular axis substantially parallel to the surface of the substrate. Typically the x-axis and y-axis define a substantially horizontal xy-plane. It can further be pointed out that an alignment in the z-direction between the patterned radiation beam, in particular a focal plane of the patterned radiation beam, and a surface of the substrate needs to be accurate as well, in order to keep the substrate in focus.

In addition, it can be pointed out that, in order to realise an accurate alignment between the pattern of the patterned radiation beam and the substrate, an accurate control of the temperature of the substrate, in particular the area that is being patterned, is required.

It can further be pointed out that similar considerations apply for the components of the lithographic apparatus that are involved in the generation of the patterned radiation beam. In particular, in order to generate the desired patterned radiation beam, an accurate control of a position, shape and temperature of the components of the illumination system and the projection system are required as well.

In order to position a substrate relative to a patterned radiation beam, positioning devices as described above can be applied. It is further known to apply cooling devices to e.g. cool substrates or optical components such as mirrors. Such devices may however be rather bulky and do not enable to control a position or temperature on a local level but rather operate on a global level, i.e. acting on the entire substrate or mirror, rather than on a detailed part or portion. Such devices may e.g. act on portions of a substrate or optical component with an insufficient spatial resolution.

Figure 4:
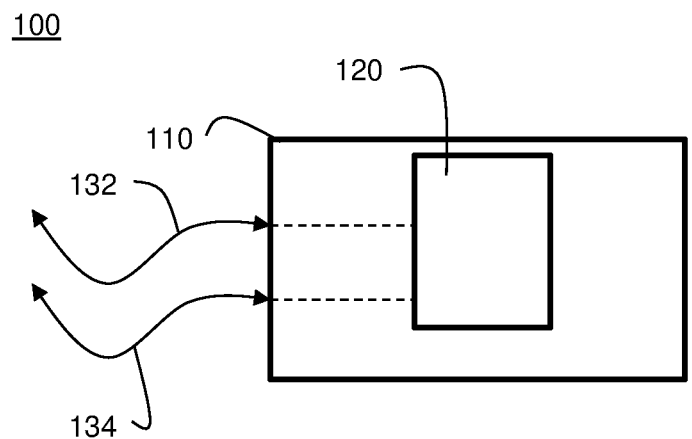
FIGS. 4-7 depict various embodiments of thermo-mechanical actuators according to the present invention.

The present invention provides in a thermo-mechanical actuator that enables to control the shape, position or temperature of an object in a more detailed manner FIG. 4 schematically shows an embodiment of a thermo-mechanical actuator 100 according to the present invention. The thermo-mechanical actuator 100 as shown comprises a piezo-electric module 110, the piezo-electric module 110 comprising at least one piezo-electric element 120.

Within the meaning of the present invention, a piezo-electric element refers to a component comprising or made of a piezo-electric material such as PZT or the like. Within the meaning of the present invention, a piezo-electric material is a material that undergoes a deformation when subjected to an electric field and which generates an electric field when subjected to a mechanical strain or pressure. It is further assumed in the present invention that a piezo-electric material as applied will also have pyro-electric characteristics and electro-caloric characteristics. Such characteristics refer to the properties of such materials to undergo a temperature change when subjected to an electric field and to generate an electric field when subjected to a heat flux.

In accordance with the present invention, the thermo-mechanical actuator is further configured to receive or provide a first signal 132 and to receive or provide a second signal 134. In an embodiment of the present invention, the first and second signals 132, 134 may be received or provided by the piezo-electric module 110 of the actuator 100. In particular, the first and second signals 132, 134 may be received or provided by the at least one piezo-electric element 120 of the actuator 100, as indicated by the dotted lines in FIG. 4.

In accordance with the present invention, the first signal 132 can be associated with a thermal property or characteristic of the piezo-electric material as applied in the piezo-electric element 120 of the thermo-mechanical actuator 100 according to the present invention. In particular, the first signal 132 can either be a thermal actuation signal for controlling a thermal behaviour of the piezo-electric module, or a thermal sensing signal representative of a thermal state of the piezo-electric module. In the latter case, the piezo-electric module, e.g. a piezo-electric element of the piezo-electric module is used as a sensor, i.e. a temperature sensor. In such case, the pyro-electric characteristic of the piezo-electric module is thus relied upon. In the former case, the piezo-electric module, e.g. a piezo-electric element of the piezo-electric module is used as a thermal actuator. Within the meaning of the present invention, thermal actuating refers to the activity of creating a heat flux. In such case the electro-caloric characteristic of the piezo-electric module is thus relied upon.

In accordance with the present invention, the second signal 134 can be associated with a mechanical characteristic of the piezo-electric material as applied in the piezo-electric element 120 of the thermo-mechanical actuator 100 according to the present invention. In particular, the second signal 134 can either be a mechanical actuation signal for controlling a mechanical behaviour of the piezo-electric module, or a mechanical sensing signal representative of a mechanical state of the piezo-electric module. In the latter case, the piezo-electric module, e.g. a piezo-electric element of the piezo-electric module is used as a sensor, i.e. a pressure or strain sensor. In such case, the piezo-electric element of the piezo-electric module of the thermo-mechanical actuator according to the present invention may generate an electric field depending on a strain or pressure it is subjected to. In the former case, the piezo-electric module, e.g. a piezo-electric element of the piezo-electric module is used as a mechanical actuator. It can deform in accordance with an electric field that is applied to it.

The thermo-mechanical actuator according to the invention may thus be applied in various operating modes, whereby a mechanical operating mode is combined with a thermal operating mode. In particular the following operating modes can be identified:

The thermo-mechanical actuator according to the invention may operate in the following mechanical operating modes:
    a first mechanical operating mode corresponding to an operation as a mechanical actuator,
    a second mechanical operating mode corresponding to an operation as a mechanical sensor.

The thermo-mechanical actuator according to the invention may operate in the following thermal operating modes:
a first thermal operating mode corresponding to an operation as a thermal actuator,
a second thermal operating mode corresponding to an operation as a thermal sensor or temperature sensor.

In an embodiment of the present invention, a piezo-electric element as applied in the thermo-mechanical actuator according to the invention is applied or used in a single operating mode of the above defined operating modes. Such piezo-electric elements may be referred to as single mode piezo-electric elements or dedicated piezo-electric elements. In such embodiment, the thermo-mechanical actuator according to the invention may comprise two or more of such elements, each element configured to operate in a particular operating mode.

Figure 5:
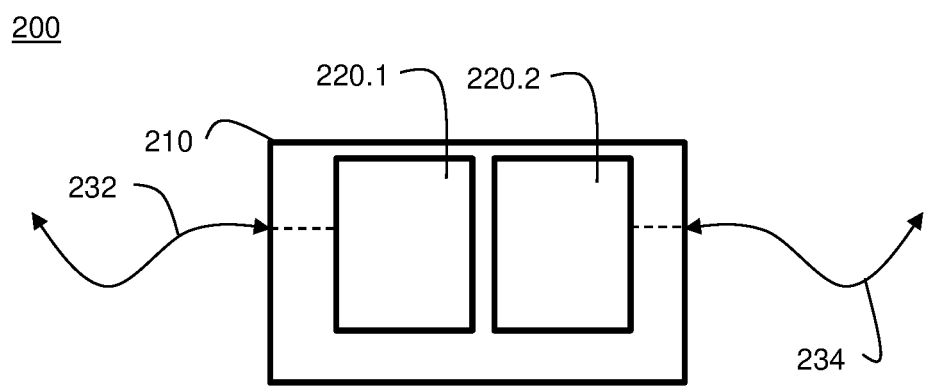

FIG. 5 schematically shows such an embodiment. FIG. 5 schematically shows a thermo-mechanical actuator 200 according to the invention, the actuator 200 comprising a piezo-electric module 210 which comprises a first piezo-electric element 220.1 and a second piezo-electric element 220.2. In the embodiment as shown, the thermo-mechanical actuator 200 is further configured to receive or provide a first signal 232 and to receive or provide a second signal 234. In the embodiment as shown, the first signal 232 is configured to be received by or provided by the first piezo-electric element 220.1, whereas the second signal 234 is configured to be received by or provided by the second piezo-electric element 220.2.

In an embodiment of the present invention, the piezo-electric element 220.1 may e.g. be operated in the first mechanical operating mode corresponding to an operation as a mechanical actuator, whereas the piezo-electric element 220.2 may e.g. be operated in the second thermal operating mode corresponding to an operation as a thermal sensor. As will be appreciated, other combinations of operating modes may be devised as well. In particular:
the piezo-electric element 220.1 may be operated as a mechanical sensor, whereas the piezo-electric element 220.2 may be operated as a thermal sensor, or
the piezo-electric element 220.1 may be operated as a mechanical sensor, whereas the piezo-electric element 220.2 may be operated as a thermal actuator, or
the piezo-electric element 220.1 may be operated as a mechanical actuator, whereas the piezo-electric element 220.2 may be operated as a thermal actuator.

In addition, the thermo-mechanical actuator according to the invention may comprise more than two piezo-electric elements as well, each of said piezo-electric elements configured to operate in one of the above described operation modes.

In an embodiment of the present invention, a piezo-electric element as applied in the thermo-mechanical actuator according to the invention can be applied or used in multiple different operating modes of the above defined operating modes. Such piezo-electric elements may be referred to as multi-mode piezo-electric elements.

Figure 6:
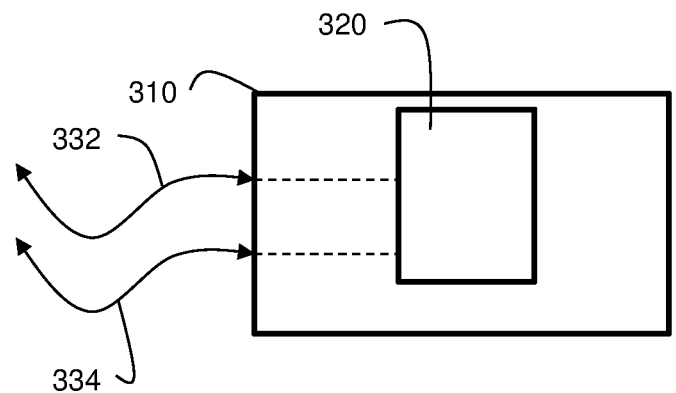

FIG. 6 schematically shows an embodiment of a thermo-mechanical actuator 300 according to the invention which includes such a multi-mode piezo-electric element 320. The thermo-mechanical actuator 300 as shown comprises a piezo-electric module 310, the piezo-electric module 310 comprising piezo-electric element 320, in particular a piezo-electric element which can be operated in different operating modes. The thermo-mechanical actuator 300 as shown is further configured to receive or provide a first signal 332 and to receive or provide a second signal 334. In the embodiment as shown, the first signal 332 and the second signal 334 are configured to be received by or provided by the piezo-electric module 310, in particular the multi-mode piezo-electric element 320 of the piezo-electric module 310.

In an embodiment, the first signal 332 may e.g. be configured to control the piezo-electric element 320 to operate in the first mechanical operating mode corresponding to an operation as a mechanical actuator, whereas the second signal 334 may e.g. be configured to control the piezo-electric element 320 to operate in the first thermal operating mode corresponding to an operation as a thermal actuator.

In an alternative embodiment, the first signal 332 may e.g. be configured to control the piezo-electric element 320 to operate in the first mechanical operating mode corresponding to an operation as a mechanical actuator, whereas the second signal 334 may be an output signal of the thermo-mechanical actuator that is provided by the piezo-electric element 320 when operating in the second thermal operating mode corresponding to an operation as a thermal sensor.

In yet another embodiment, the thermo-mechanical actuator according to the invention comprises two or more multi-mode piezo-electric elements. Such an embodiment is schematically shown in FIG. 7.

Figure 7:
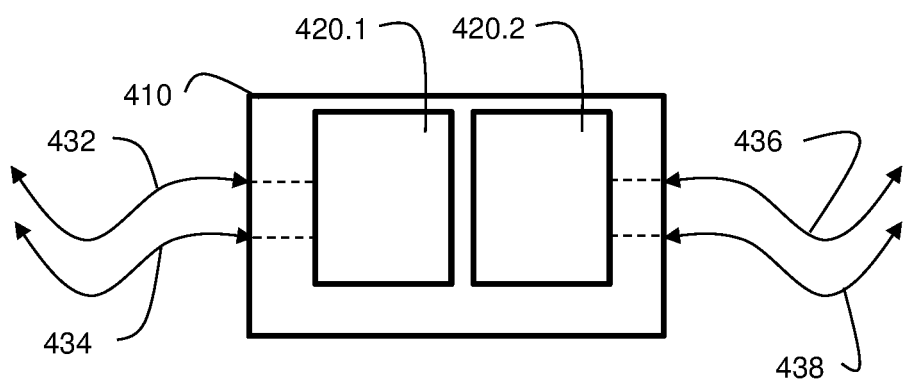

FIG. 7 schematically shows an embodiment of a thermo-mechanical actuator 400 according to the invention which includes two multi-mode piezo-electric elements 420.1 and 420.2. The thermo-mechanical actuator 400 as shown comprises a piezo-electric module 410, the piezo-electric module 410 comprising a first multi-mode piezo-electric element 420.1 and a second multi-mode piezo-electric element 420.2, i.e. piezo-electric elements which can be operated in different operating modes. The thermo-mechanical actuator 400 as shown is further configured to receive or provide a first signal 432 and to receive or provide a second signal 434. In the embodiment as shown, the first signal 432 and the second signal 434 are configured to be received by or provided by the first multi-mode piezo-electric element 420.1 of the piezo-electric module 410. The thermo-mechanical actuator 400 as shown is further configured to receive or provide a third signal 436 and to receive or provide a fourth signal 438. In the embodiment as shown, the third signal 436 and the fourth signal 438 are configured to be received by or provided by the second multi-mode piezo-electric element 420.2 of the piezo-electric module 410.

In such embodiment, the first signal 432 and the second signal 434 can e.g. be associated with an operation of the thermo-mechanical actuator as a mechanical sensor and a mechanical actuator respectively, whereas the third signal 436 and the fourth signal 438 can e.g. be associated with an operation of the thermo-mechanical actuator as a thermal sensor and a thermal actuator respectively.

In the present invention, a thermo-mechanical actuator is disclosed which is configured to operate both in a thermal operating mode and a mechanical operating mode. In an embodiment, as will be illustrated in more detail below, the thermo-mechanical actuator can be configured to simultaneously operate in both operating modes. In such embodiment, the thermo-mechanical actuator according to the present invention may e.g. operate as a temperature sensor and at the same time, operate as a mechanical actuator. Such functionality may either be incorporated in a single piezo-electric element or in a combination of multiple, e.g. two, piezo-electric elements. In an embodiment, the thermo-mechanical actuator can be configured to alternatingly operate in two or more operating modes, e.g. alternating operate in a sensing mode and in an actuating mode or alternatingly operate in thermal actuating mode and in a mechanical actuating mode.

In the present invention, a thermo-mechanical actuator is described that makes use of one or more piezo-electric elements. Such elements are generally known and exhibit the characteristic of deforming when an electrical field is applied to it and, inversely, generate an electrical field when a pressure or strain is applied to it. The piezo-electric materials as applied in such elements further exhibit a behaviour or characteristic that is known as electro-caloric behaviour or pyro-electric behaviour. An electro-caloric behaviour, which is also referred to as the electro-caloric effect (ECE), refers to the characteristic of a piezo-electric material to change its temperature when an electric field inside the element is changed or when an electric field is applied. The pyro-electric effect refers to the inverse effect, whereby a temperature change in a piezo-electric element results in the occurrence or generation of an electric field in the piezo-electric element. The electro-caloric effect (ECE) has been well documented in literature. Reference can e.g. be made to: https://www.springer.com/gp/book/9783642402630, Electrocaloric Materials, New Generation of Coolers by Correia, Tatiana and Zhang, Qi.

In the thermo-mechanical actuator according to the present invention, use is made of both the piezo-electric and the electro-caloric properties of piezo-electric materials. In particular, the thermo-mechanical actuator according to the invention can operate, in an embodiment, as a mechanical actuator when an electrical field is applied inside a piezo-electric element of the piezo-electric module of the thermo-mechanical actuator, said electrical field causing the piezo-electric element to deform. Note that this corresponds to the first mechanical operating mode as described above. The thermo-mechanical actuator according to the invention may also operate, in an embodiment, as a mechanical sensor when an electrical field is generated inside a piezo-electric element of the piezo-electric module, said electrical field being caused by a deformation of the piezo-electric element. Note that this corresponds to the second mechanical operating mode as described above.

With respect to the electro-caloric effect (ECE), it can be pointed out that this process or effect can be considered to be substantially adiabatic. This means that, when an electric field is applied to a piezo-electric material, a temperature change will occur. Such a temperature change will cause the piezo-electric element comprising the piezo-electric material to change its temperature relative to its surrounding, e.g. components to which the piezo-electric element is connected or mounted. In such case, the temperature change will cause a heat flux to the piezo-electric element or from the piezo-electric element, depending on the sign of the temperature change.

With respect to the effects as described, it can further be pointed out that these effects are direction dependent, depending on the orientation of the crystalline structure of the materials applied. The above mentioned effects can be described by tensors which can e.g. describe the correlation between the application of an electric field E, which can be expressed as a directional field (Ex, Ey, Ez) in three orthogonal directions x, y, z, and the mechanical and thermal effects of the electrical field. Note that the mechanical effects may include elongation or compression of the piezo-electric element but also shearing effects. It can also be pointed out that the mechanical and thermal effects as perceived may also depend on the frequency of the applied electric field.

In order to generate the aforementioned electric field inside the piezo-electric elements or to sense any electrical fields that are induced or generated inside the piezo-electric element or elements, the one or more piezo-electric elements as applied in the thermo-mechanical actuator according to the present invention may be provided with one or more electrodes.

Figure 8:
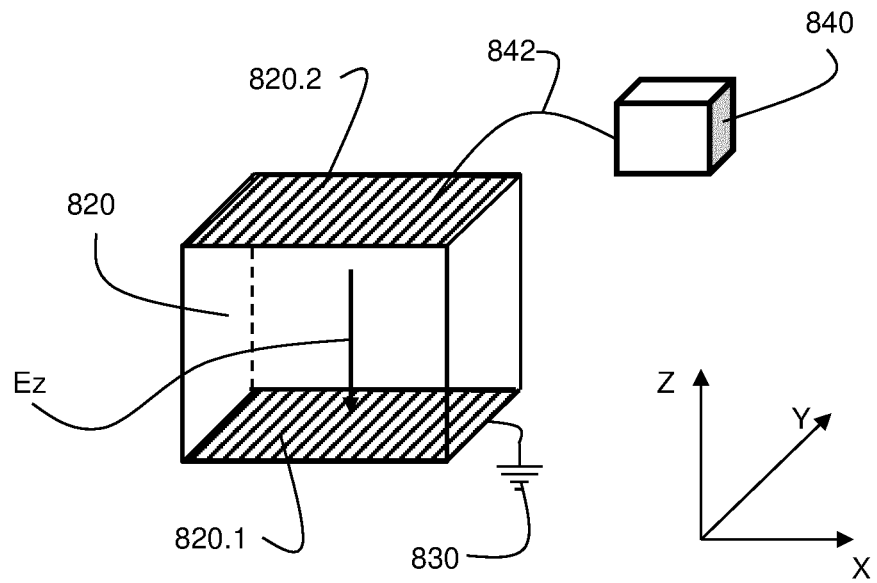
FIGS. 8-10 depict various embodiments of piezo-electric elements as can be applied in a thermo-mechanical actuator according to the present invention.

FIG. 8 schematically shows a piezo-electric element 820 as can be applied in a piezo-electric module of a thermo-mechanical actuator according to the present invention. In the embodiment as shown, the piezo-electric element 820 has a cubical shape and is provided with a pair of electrodes, a bottom electrode 820.1 and a top electrode 820.2. In an embodiment, the bottom electrode 820.1 may e.g. be connected to a ground or ground potential 830. When the top electrode 820.2 is connected to a voltage source 840 and provided with a voltage signal 842, an electric field Ez is generated in the piezo-electric element 820, the electric field Ez being directed in the indicated Z-direction. In an embodiment, such an electric field Ez may e.g. cause the piezo-electric element 820 to deform, e.g. elongate, compress or shear. In such case, the voltage signal 842 as provided to the electrode 820.1 may also be referred to as a mechanical actuation signal. In an embodiment, the electric field Ez as generated by the voltage signal may also cause a temperature change of the piezo-electric element. In such case, the voltage signal 842 may also be referred to as a thermal actuation signal.

In an embodiment of the present invention, the thermo-mechanical actuator according to the invention is configured to operate both as a mechanical actuator and as a thermal actuator, whereby the actuation signals are combined or superimposed. In such embodiment, the mechanical actuation signal may e.g. be a DC signal for generating a DC electric field Ez_dc resulting in a deformation of the piezo-electric element 800, whereas the thermal actuation signal may e.g. be an AC signal for generating an AC electric field Ez_ac, which causes a temperature change in the piezo-electric element 800. In such embodiment, Ez=Ez_dc+Ez_ac. With respect to such an embodiment, it can be pointed out that the occurring temperature change may depend on the frequency of the AC electric field Ez_ac. It can also be mentioned that, when the frequency of the AC electric field Ez_ac is comparatively low, the impact on the mechanical actuation may be low, thus enabling a substantially independent control of the mechanical actuation and the thermal actuation. As an alternative to an AC signal for generating an AC electric field Ez_ac, a DC signal that is switched on and off at a certain duty cycle or frequency may also be applied.

In an embodiment, the voltage source 840 may comprise a control unit for generating the required control signals or operating signals 842.

An alternative manner for obtaining a substantially independent control of the applied or desired operating modes is to apply multiple electrodes that are configured to generate electric fields in different directions in the piezo-electric element or elements as applied. By a suitable choice of piezo-electric material and suitable orientation of the element or elements and electrodes, the thermal and mechanical operating modes can be decoupled.

Figure 9:
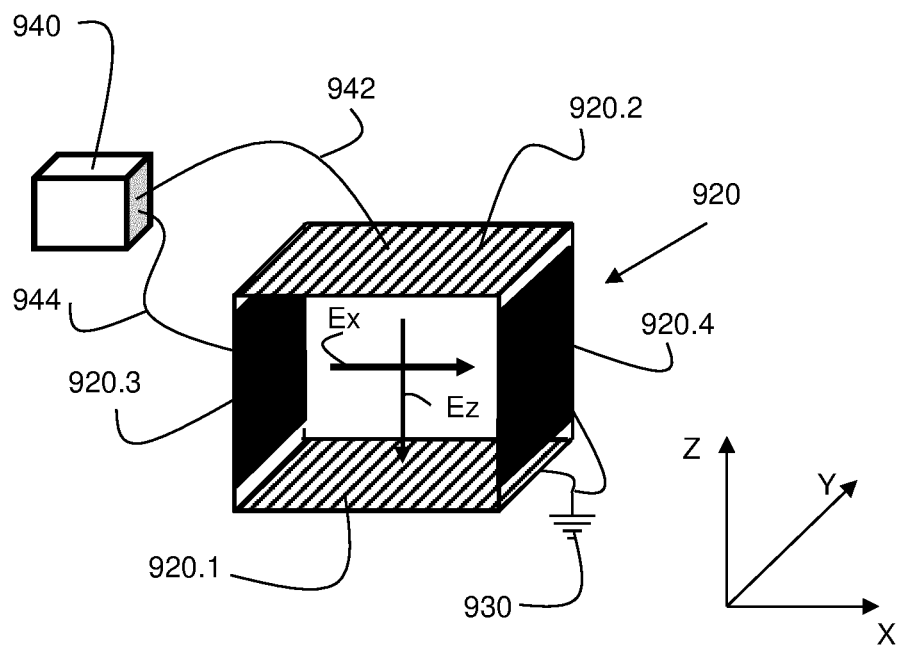

FIG. 9 schematically shows a piezo-electric element 920 which can be applied in such operating modes. The piezo-electric element 920 can e.g. be applied in a piezo-electric module of a thermo-mechanical actuator according to the present invention. In the embodiment as shown, the piezo-electric element 920 has a cubical shape and is provided with a first pair of electrodes comprising a bottom electrode 920.1 and a top electrode 920.2 and with a second pair of electrodes comprising a left-side electrode 920.3 and a right-side electrode 920.4. In an embodiment, the bottom electrode 920.1 and the right-side electrode 920.4 may e.g. be connected to a ground or ground potential 930. When the top electrode 920.2 is connected to a voltage source 940 and provided with a voltage signal 942, an electric field Ez is generated in the piezo-electric element 920, the electric field Ez being directed in the indicated Z-direction. In an embodiment, such an electric field Ez may e.g. cause the piezo-electric element 920 to deform, e.g. elongate, compress or shear. In such case, the voltage signal 942 as provided to the electrode 920.2 may also be referred to as a mechanical actuation signal. When the left-side electrode 920.3 is connected to the voltage source 940 and provided with a voltage signal 944, an electric field Ex is generated in the piezo-electric element 920, the electric field Ex being directed in the indicated X-direction. In an embodiment, such an electric field Ex may e.g. cause a temperature change of the piezo-electric element 920. In such case, the voltage signal 944 may also be referred to as a thermal actuation signal.

In an embodiment, the voltage source 940 may comprise a control unit for generating the required control signals or operating signals 942 and 944.

In an embodiment, the piezo-electric module as applied in a thermo-mechanical actuator according to the invention comprises multiple piezo-electric elements, each of said elements being provided with one or more electrodes for either receiving an actuator signal or providing a sensing signal.

Figure 10:
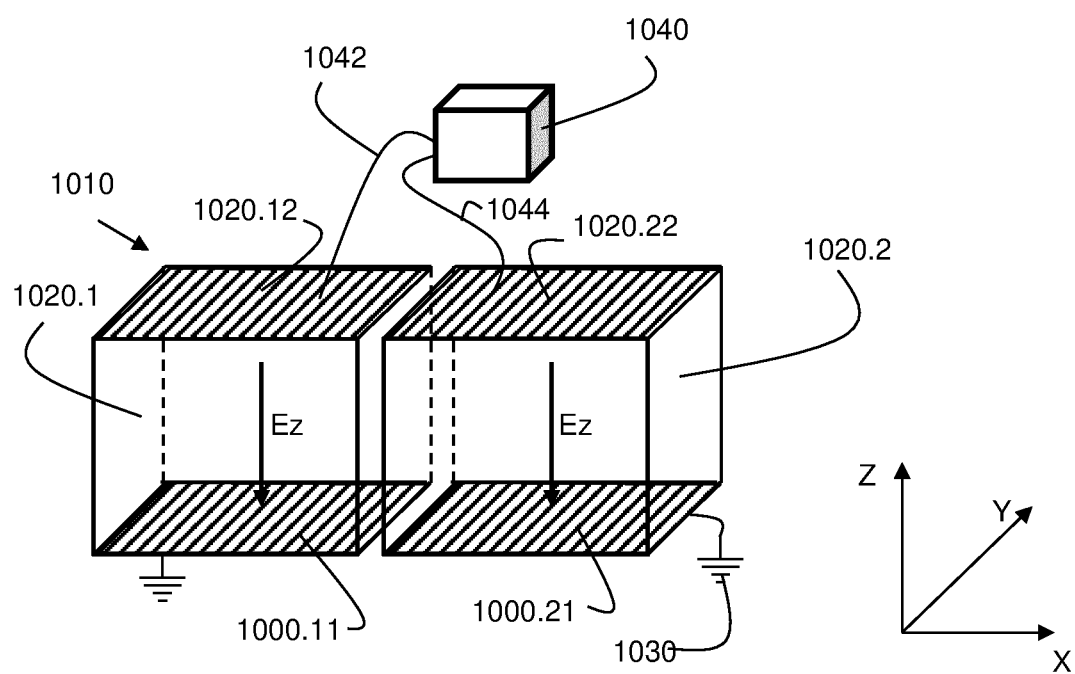

FIG. 10 schematically shows a piezo-electric module 1010 as can be applied in a thermo-mechanical actuator according to the invention. In the embodiment as shown, the piezo-electric module 1010 comprises two piezo-electric elements 1020.1 and 1020.2, each having a cubical shape and being provided with a pair of electrodes, i.e. bottom electrodes 1000.11, 1000.21 and top electrodes 1020.12, 1020.22. In an embodiment, the bottom electrodes 1000.11, 1000.21 may e.g. be connected to a ground or ground potential 1030. It can be pointed out that the two piezo-electric elements 1020.1, 1020.2, or in general the applied multiple elements, may have a common electrode, e.g. a common ground electrode. Both elements 1020.1 and 1020.2 may e.g. be controlled in a similar manner as described above. As an example, the top electrode 1020.12 is connected to a voltage source 1040 and provided with a voltage signal 1042, an electric field Ez is generated in the piezo-electric element 1020.1, the electric field Ez being directed in the indicated Z-direction. In an embodiment, such an electric field Ez may e.g. cause the piezo-electric element 1020.1 to deform, e.g. elongate, compress or shear. Further, the top electrode 1020.22 of element 1020.2 may be connected to the voltage source 1040 and provided with a voltage signal 1044, causing an electric field Ez to be generated in the piezo-electric element 1020.2, the electric field Ez being directed in the indicated Z-direction. In an embodiment, such an electric field Ez may e.g. cause the piezo-electric element 1020.2 to heat up or cool down.

As will be understood by the skilled person, the piezo-electric elements 820 or 920 or the piezo-electric module 1010 may be combined so as to form larger or more detailed thermo-mechanical actuators. In an embodiment, the thermo-mechanical actuator according to the invention comprises a plurality of piezo-electric elements or piezo-electric modules, said elements or modules e.g. being arranged in a one-dimensional or two-dimensional array.

By means of such a thermo-mechanical actuator, a detailed thermal and mechanical control of an object can be obtained.

In a lithographic apparatus, such a detailed thermal and mechanical control is desired and/or required at various locations and during various processes. Referring to the above described lithographic apparatus and exposure or patterning process, it can e.g. be pointed out that an accurate positioning of the substrate and/or the patterning device is required, both in a plane that is parallel to the surface of the substrate or patterning device and in a direction parallel to the radiation beam or patterned radiation beam. Such accurate positioning is required to ensure that the patterned beam of radiation is accurately positioned relative to the substrate, in particular relative to a previously provided pattern on the substrate. In order to obtain such an accurate positioning, an accurate temperature control of the substrate and patterning device is required as well. In addition, it can be pointed out that the illumination system IL and the projection system PS comprise one or more optical elements, e.g. mirrors or lenses, which also need to be accurately controlled, both from a thermal and from a mechanical perspective, in order to accurately shape and position the patterned radiation beam.

As such, in an embodiment of the present invention, the thermo-mechanical actuator according to the present is applied to control a component of a lithographic apparatus or an object that is used in a lithographic apparatus or processed in a lithographic apparatus. Examples of such components include but are not limited to object tables for holding objects such as patterning devices or substrates, clamps, e.g. vacuum or electrostatic clamps, for clamping objects such as patterning devices or substrates, optical elements such as lenses and mirrors. Such an embodiment can e.g. be described as an assembly comprising:

a component for a lithographic apparatus, and a thermo-mechanical actuator according to the invention, wherein the thermo-mechanical actuator is configured to control a thermal behaviour and mechanical behaviour of the component.

Figure 11:
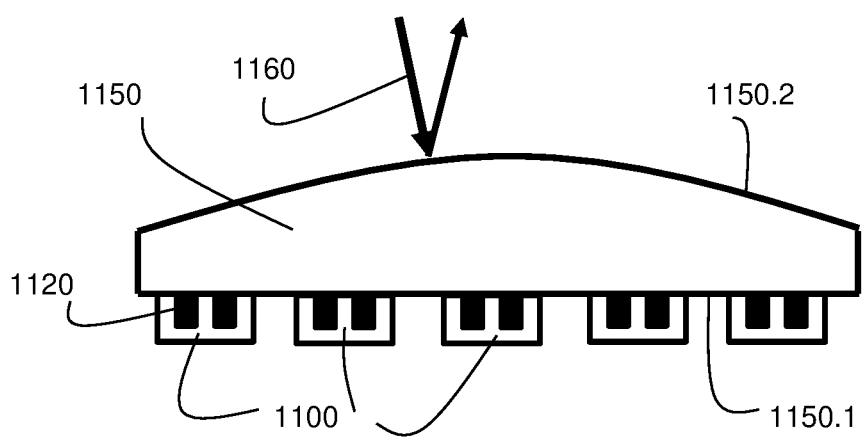
FIGS. 11-12 depict embodiments of assemblies according to the present invention.

FIG. 11 schematically shows such an assembly. FIG. 11 schematically shows a component 1150 for a lithographic apparatus and a plurality of thermo-mechanical actuators 1100 according to the present invention. The component 1150 as shown may e.g. be an optical component, in particular a mirror that is configured to reflect an incoming beam 1160 of radiation. In accordance with the present invention, the thermo-mechanical actuators 1100 can control both the thermal and mechanical behaviour of the component and/or sense the thermal and mechanical behaviour of the component. In the embodiment as shown, each actuator 1100 comprise two piezo-electric elements 1120, to illustrate the dual functionality, both thermal and mechanical, of the actuator. In the embodiment as shown, the thermo-mechanical actuators 1100 are mounted to a bottom surface 1150.1 of the component 1150 which is a mirror in this embodiment. Note that, depending on the orientation of the component 1150, it may be sufficient that the actuators merely support the component 1150. By suitable control of the actuators 1100, i.e. by providing the actuators with suitable actuating signals or obtaining sensing signals, both the thermal and mechanical behaviour can be controlled. In particular, the thermo-mechanical actuators 1100 may e.g. be configured to exert forces on the bottom surface 1150.1 and, as a result, deform the top surface 1150.2 of the mirror. By doing so, the top surface 1150.2, i.e. the surface reflecting the incoming beam 1160 can be brought or maintained in the required or desired shape and/or position. Similarly, the thermo-mechanical actuators 1100 may be configured to control the thermal behaviour of the component, e.g. the temperature or the temperature distribution of the component. This can e.g. be realised by suitable heating or cooling of the piezo-electric elements of the thermo-mechanical actuators, as described above. By doing so, a desired temperature or temperature distribution of the component 1150 can be obtained or maintained. In an embodiment, the thermo-mechanical actuators 1100 may e.g. be mounted to a common frame. Such an arrangement is shown in FIG. 12.

Figure 12:
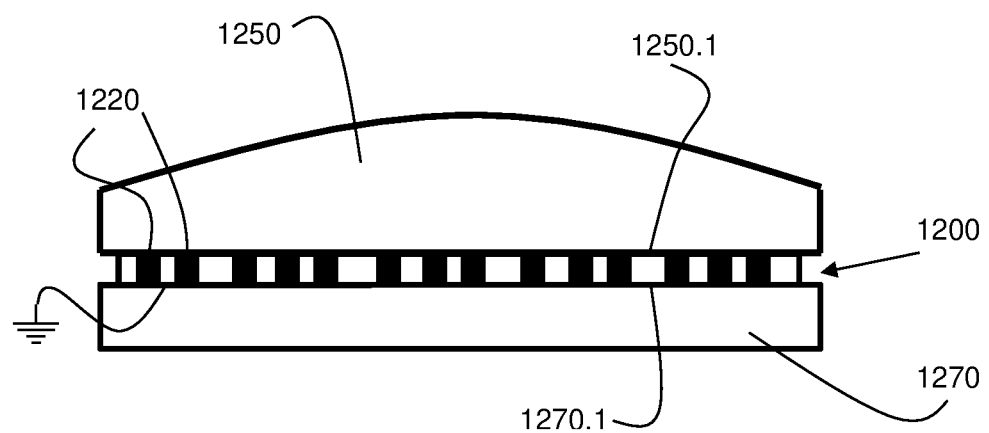
Figure 13A:
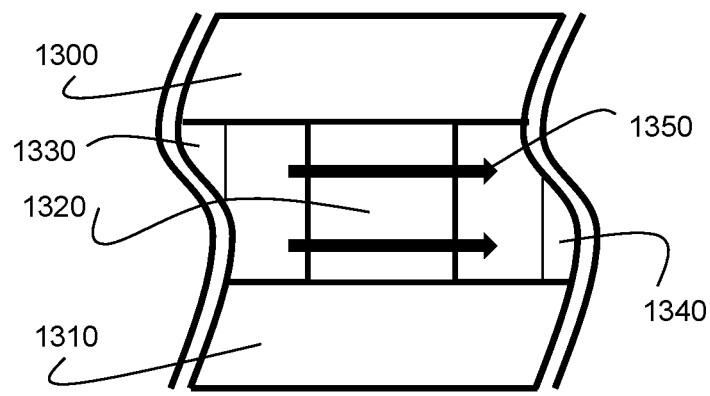
FIG. 13 depicts an operating cycle of an actuator according to the present invention.
Figure 13B:
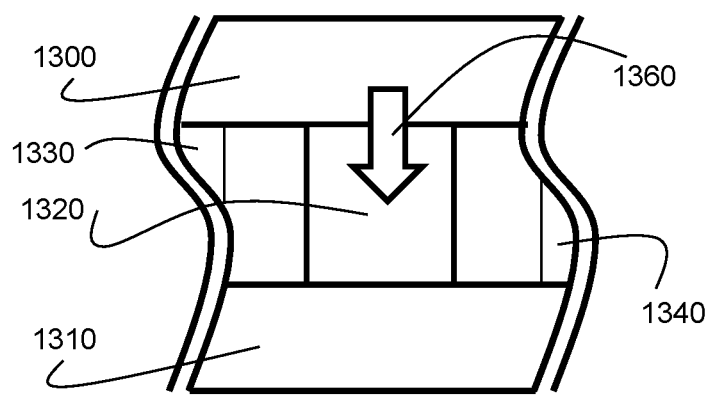
Figure 13C:
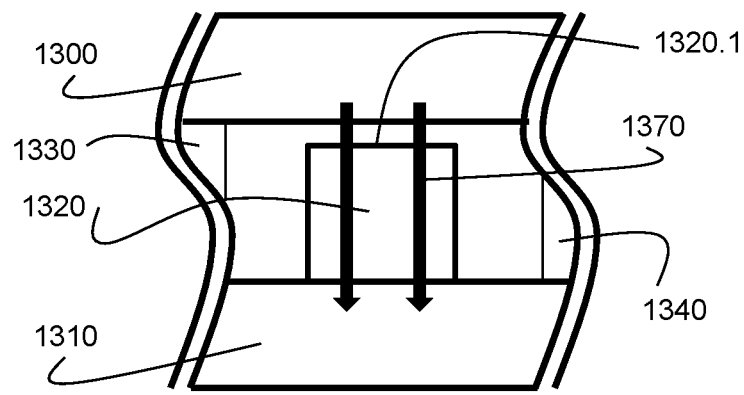
Figure 13D:
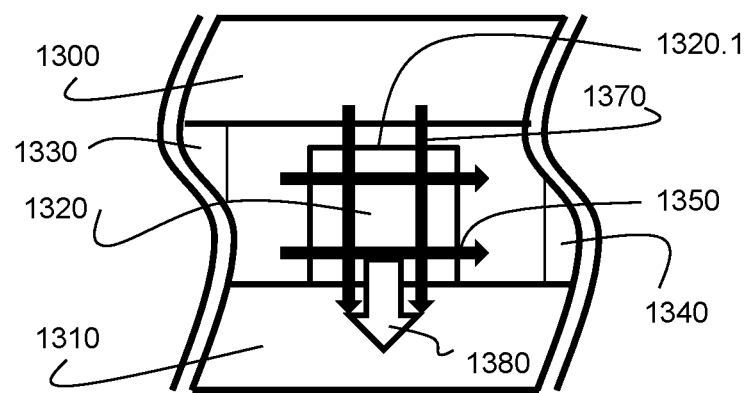
Figure 13E:
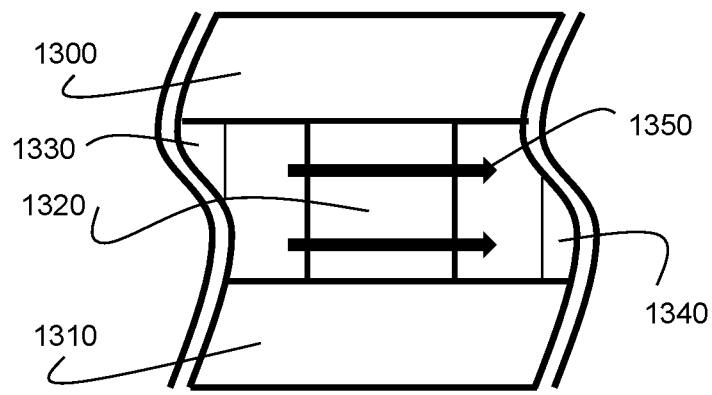

FIG. 12 schematically shows a component 1250 for a lithographic apparatus and a thermo-mechanical actuator 1200 according to the present invention. The component 1250 as shown may e.g. be an optical component. In the embodiment as shown, the thermo-mechanical actuator 1200 comprise a plurality of piezo-electric elements 1220. In the embodiment as shown, the thermo-mechanical actuator 1200, in particular the piezo-electric elements 1220 of the actuator, are configured to engage with a bottom surface 1250.1 of the component 1250. In such embodiment, the bottom surface 1250.1 of the component 1250 may e.g. be in contact with end-surfaces of the piezo-electric elements 1220. Such end-surfaces may e.g. form a support surface for supporting the component 1250 or a mounting surface onto which the component 1250 can be mounted. By suitable control of the actuator 1200, i.e. by providing the piezo-electric elements 1220 of the actuator 1200 with suitable actuating signals or obtaining sensing signals, both the thermal and mechanical behaviour of the component 1250 can be controlled. In the embodiment as shown, the piezo-electric elements 1220 are mounted to a common member or frame 1270. Such a frame can e.g. comprise a substantially rigid structure, e.g. made from a material having a low thermal expansion coefficient or a thermal expansion coefficient being the same or about the same as that of the material of the component. Preferably, the frame 1270 is made from or comprises a material having a high thermal conductivity, e.g. to facilitate the removal of heat extracted from the component 1250. In the embodiment as shown, top surface 1270.1 of the frame 1270 is provided with a common grounding electrode for grounding the piezo-electric elements. Alternatively, the bottom surface 1250.1 of the component 1250 may be provided with such a grounding electrode. In an embodiment of the present invention, the common frame 1270 may e.g. serve as a heat sink to remove heat from the component 1250.

FIG. 13 schematically shows a more detailed operating mode of the thermo-mechanical actuator according to the invention, whereby a thermal and a mechanical operating mode are combined. FIG. 13 schematically shows a sequence of operations as can be performed by a thermo-mechanical actuator according to the present invention. In FIG. 13, 1300 denotes a component that is to be controlled, 1310 denotes a heat sink, i.e. a mass that is e.g. held at a substantially constant temperature, e.g. by means of a coolant. 1320 denotes a piezo-electric element of a thermo-mechanical actuator according to the invention, 1330 and 1340 are portions of adjacent piezo-electric elements of the thermo-mechanical actuator. FIG. 13 (a) illustrates the initial state for the operating mode or cycle. In FIG. 13 (a) the arrows 1350 denote the electric field applied to the piezo-electric element 1320 in the initial state. In the embodiment, it is assumed that the element 1320 is in a thermally neutral state when the electric field 1350 is present. It is further assumed that a removal of the electric field 1350 will cause a temperature drop in the piezo-electric element 1320 and that the application (or re-application) of an electric field will cause a temperature rise of the piezo-electric element 1320. In the thermally neutral state, it can be assumed that the temperature of the element 1320 substantially corresponds to the temperature of the heat sink 1310.

In a first step of the operating cycle, illustrated in FIG. 13 (b), the electric field 1350 is removed, causing the piezo-electric element 1320 to cool. As a result, a heat flux 1360 will occur from the component 1300 to the element 1320 causing the element to warm up. Phrased differently, the piezo-electric element 1320 will absorb heat from the component 1300.

In a second step of the operating cycle, illustrated in FIG. 13 (c), an electric field 1370, having a different orientation as the electric field 1350, is applied to the element 1320, said electric field 1370 causing the piezo-electric element 1320 to compress. As can be seen, said compression causes a gap to be generated between the component and the top surface 1320.1 of the element 1320.

In a third step of the operating cycle, illustrated in FIG. 13 (d), the electric field 1350, or a field with similar orientation, is re-applied, causing the element 1320 to heat up. As a result, a heat flux 1380 will occur from the piezo-electric element 1320 towards the heat sink 1310. Once the heat flux 1380 has been transferred to the heat sink 1310, the electric field 1370 can be removed, causing the element to elongate and causing the actuator to be in the initial state of FIG. 13 (a) again. This state is shown in FIG. 13 (e). By repeating the above described cycle, heat can e.g. be removed from an object that is subjected to a heat load, e.g. a component from an optical system such as a projection system or illumination system of a lithographic apparatus, or a patterning device or substrate as used in a lithographic apparatus.

In an embodiment of the present invention, the operating mode of the thermo-mechanical actuator or actuators applied may vary over time. Such an embodiment is schematically illustrated in FIG. 14.

Figure 14:
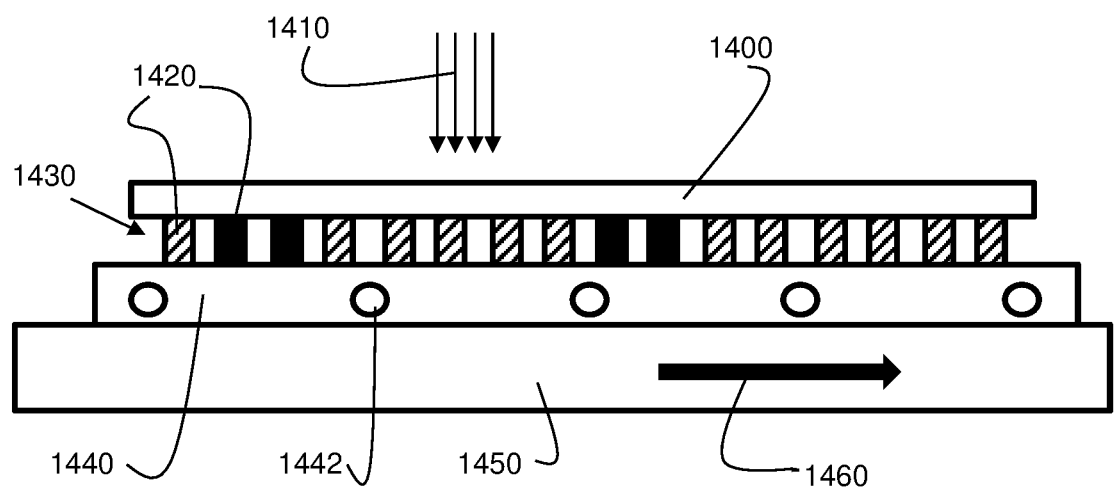
FIG. 14 depicts an operation of an actuator according to the present invention during an exposure sequence.

FIG. 14 schematically illustrates an exposure process of a substrate 1400 by a patterned radiation beam 1410. In the embodiment as shown, the substrate 1400 is supported by a plurality of piezo-electric elements 1420 of a thermo-mechanical actuator 1430 according to the present invention. In the embodiment as shown, the thermo-mechanical actuator 1430 is mounted to a heat sink 1440, said heat sink 1440 being provided with cooling channels 1442 for receiving a coolant. The assembly of the substrate, the actuator and the heat sink is mounted to a positioning device 1450 that is configured to displace the substrate 1400 relative to the radiation beam 1410, e.g. in the direction as indicated by the arrow 1460. In the embodiment as shown, the piezo-electric elements 1420 are primarily applied to control a position of the substrate 1400, i.e. they operate in a mechanical actuation mode. In order to take account of the heat load provided by the radiation beam 1410, certain elements 1420, said elements being indicated as filled in black, operate in a thermal mode to remove heat from the substrate 1400. As such, in the embodiment as shown, the operating mode of the elements 1420 of the actuator 1430 depends on the relative position of the radiation beam 1410 and the elements 1420.

It can be mentioned that a large variety of materials can be applied as piezo-electric elements in the thermo-mechanical actuator according to the invention, such materials e.g. including PZT, PMN-PT, PZN, BaTiO, $LiNbO_3$, etc. . . . .

In order to manufacture the thermo-mechanical actuator according to the invention, various techniques can be applied, similar to manufacturing techniques applied for classical piezo-actuators. In addition, thin film techniques including PLD, spin coating or spray coating can be applied as well.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

<Application Areas>

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Other aspects of the invention are set-out as in the following numbered clauses.

1. A thermo-mechanical actuator comprising a piezo-electric module, the piezo-electric module comprising at least one piezo-electric element, wherein the thermo-mechanical actuator is configured to:
 receive a thermal actuation signal for controlling a thermal behaviour of the piezo-electric module, or
 provide a thermal sensing signal representative of a thermal state of the piezo-electric module, and,
wherein the thermo-mechanical actuator is configured to:
 o receive a mechanical actuation signal for controlling a mechanical behaviour of the piezo-electric module, or
 o provide a mechanical sensing signal representative of a mechanical state of the piezo-electric module.

2. The thermo-mechanical actuator according to clause 1, wherein the thermal actuation signal is configured to create a heat flux within the piezo-electric module and wherein the mechanical actuation signal is configured to deform the piezo-electric module.

3. The thermo-mechanical actuator according to clause 2, wherein the thermal actuation signal is configured to create a heat flux within a first piezo-electric element of the piezo-electric module and wherein the mechanical actuation signal is configured to deform a second piezo-electric element of the piezo-electric module.

4 The thermo-mechanical actuator according to clause 2, wherein the thermal actuation signal is configured to create a heat flux within a first piezo-electric element of the piezo-electric module and wherein the mechanical actuation signal is configured to deform the first piezo-electric element of the piezo-electric module.

5. The thermo-mechanical actuator according to any of the preceding clauses, further comprising a control unit for controlling the piezo-electric module.

6. The thermo-mechanical actuator according to clause 5, wherein the control unit is configured to provide the thermal actuation signal and the mechanical actuation signal to the piezo-electric module.

7. The thermo-mechanical actuator according to clause 5, wherein the control unit is configured to receive the thermal sensing signal and the mechanical sensing signal from the piezo-electric module.

8. The thermo-mechanical actuator according to clause 6, wherein the control unit is configured to provide the thermal actuation signal and the mechanical actuation signal alternatingly to the piezo-electric module.

9. The thermo-mechanical actuator according to clause 6, wherein the control unit is configured to provide the thermal actuation signal and the mechanical actuation signal simultaneously to the piezo-electric module.

10. The thermo-mechanical actuator according to clause 5, wherein the control unit is configured to alternatingly receive the thermal sensing signal from the piezo-electric module and provide the thermal actuation signal to the piezo-electric module.

11. The thermo-mechanical actuator according to clause 5, wherein the control unit is configured to receive the thermal sensing signal from a first piezo-electric element of the piezo-electric module and provide the thermal actuation signal to a second piezo-electric element of the piezo-electric module.

12 The thermo-mechanical actuator according to any of the preceding clauses, wherein the piezo-electric module comprises a plurality of piezo-electric elements configured to be controlled by either the thermal actuation signal, the mechanical actuation signal or both.

13. The thermo-mechanical actuator according to clause 12, wherein the plurality of piezo-electrical elements are arranged in a substantially planar array.

14. The thermo-mechanical actuator according to any of the preceding clauses, further comprising a heat sink configured to remove heat from the piezo-electric module and/or supply heat to the piezo-electric module.

15 An optical element comprising one or more thermo-mechanical actuators according to any of the preceding clauses.

16. The optical element according to clause 15, wherein the thermo-mechanical actuator is configured to deform a surface of the optical element and control a temperature of the optical element.

17 An object table comprising a support surface for supporting an object, the object table further comprising a thermo-mechanical actuator according to any of the preceding clauses. 18. The object table according to clause 17, wherein the thermo-mechanical actuator is configured to deform the support surface.

19 The object table according to clause 18, wherein the thermo-mechanical actuator comprises a plurality of piezo-electric elements, end-surfaces of said plurality of piezo-electric elements forming the support surface.

20. The object table according to any of the clauses 17 to 19, further comprising a clamping mechanism for clamping an object to the support surface.

21. The object table according to clause 20, wherein the clamping mechanism comprises an electrostatic clamp or a vacuum clamp.

22. A stage apparatus comprising:
an object table according to any of the clauses 17 to 21, and
a positioning device for positioning the object table.

23. A lithographic apparatus comprising a stage apparatus according to clause 22.

24. An assembly comprising:
o a component for a lithographic apparatus, and
o a thermo-mechanical actuator according to any of the clauses 1 to 14,
wherein the thermo-mechanical actuator is configured to control a thermal behaviour and mechanical behaviour of the component.

The invention claimed is:

1. A thermo-mechanical actuator, comprising:
a piezo-electric module having at least one piezo-electric element,
wherein the thermo-mechanical actuator is configured to:
receive a thermal actuation signal for controlling a thermal behaviour of the piezo-electric module, or provide a thermal sensing signal representative of a thermal state of the piezo-electric module; and
receive a mechanical actuation signal for controlling a mechanical behaviour of the piezo-electric module, or provide a mechanical sensing signal representative of a mechanical state of the piezo-electric module,
wherein the thermal actuation signal is configured to create a heat flux within the piezo-electric module, and
wherein the mechanical actuation signal is configured to deform the piezo-electric module.

2. The thermo-mechanical actuator of claim 1, wherein the piezo-electric module comprises first and a second piezo-electric elements, wherein the thermal actuation signal is configured to create a heat flux within the first piezo-electric element, and wherein the mechanical actuation signal is configured to deform the second piezo-electric element.

3. The thermo-mechanical actuator of claim 1, wherein the piezo-electric module comprises a first piezo-electric element, wherein the thermal actuation signal is configured to create a heat flux within the first piezo-electric element, and wherein the mechanical actuation signal is configured to deform the first piezo-electric element.

4. The thermo-mechanical actuator of claim 1, further comprising a control unit for controlling the piezo-electric module.

5. The thermo-mechanical actuator of claim 4, wherein the control unit is configured to provide the thermal actuation signal and the mechanical actuation signal to the piezo-electric module.

6. The thermo-mechanical actuator of claim 4, wherein the control unit is configured to alternatingly receive the thermal sensing signal from the piezo-electric module and provide the thermal actuation signal to the piezo-electric module.

7. The thermo-mechanical actuator of claim 4, wherein the control unit is configured to receive the thermal sensing signal from a first piezo-electric element of the piezo-electric module and provide the thermal actuation signal to a second piezo-electric element of the piezo-electric module.

8. The thermo-mechanical actuator of claim 1, wherein the piezo-electric module comprises a plurality of piezo-electric elements configured to be controlled by either the thermal actuation signal, the mechanical actuation signal or both.

9. The thermo-mechanical actuator of claim 8, wherein the plurality of piezo-electric elements are configured in a substantially planar array.

10. The thermo-mechanical actuator of claim 1, further comprising a heat sink configured to remove heat from the piezo-electric module and/or supply heat to the piezo-electric module.

11. An optical element comprising one or more thermo-mechanical actuators of claim 1.

12. The optical element of claim 11, wherein the thermo-mechanical actuator is configured to deform a surface of the optical element and control a temperature of the optical element.

13. An assembly comprising:
a component for a lithographic apparatus; and
the thermo-mechanical actuator of claim 1,
wherein the thermo-mechanical actuator is configured to control a thermal behaviour and mechanical behaviour of the component.

14. An object table comprising
a support surface for supporting an object; and
a thermo-mechanical actuator comprising a piezo-electric module, the piezo-electric module comprising at least one piezo-electric element,
wherein the thermo-mechanical actuator is configured to:
receive a thermal actuation signal for controlling a thermal behaviour of the piezo-electric module, or provide a thermal sensing signal representative of a thermal state of the piezo-electric module; and
receive a mechanical actuation signal for controlling a mechanical behaviour of the piezo-electric module, or provide a mechanical sensing signal representative of a mechanical state of the piezo-electric module,
wherein the thermal actuation signal is configured to create a heat flux within the piezo-electric module, and
wherein the mechanical actuation signal is configured to deform the piezo-electric module.

15. The object table of claim 14, wherein the thermo-mechanical actuator is configured to deform the support surface.

16. The object table of claim 15, wherein the thermo-mechanical actuator comprises a plurality of piezo-electric elements, end-surfaces of the plurality of piezo-electric elements forming the support surface.

17. The object table of claim 14, further comprising a clamping mechanism for clamping an object to the support surface.

18. The object table of claim 17, wherein the clamping mechanism comprises an electrostatic clamp or a vacuum clamp.

19. A stage apparatus comprising:
the object table of claim 14; and
a positioning device for positioning the object table.

20. A lithographic apparatus comprising
a stage apparatus with the object table of claim 14; and
a positioning device for positioning the object table.

* * * * *

UNITED STATES PATENT AND TRADEMARK OFFICE
CERTIFICATE OF CORRECTION

| | | |
|---|---|---|
| PATENT NO. | : 12,117,739 B2 | Page 1 of 2 |
| APPLICATION NO. | : 17/629202 | |
| DATED | : October 15, 2024 | |
| INVENTOR(S) | : Jansen et al. | |

It is certified that error appears in the above-identified patent and that said Letters Patent is hereby corrected as shown below:

On the Title Page

Column 2, Item (57), under "ABSTRACT", Line 2, delete "piezo¬electric" and insert -- piezo-electric --, therefor.

Column 2, Item (57), under "ABSTRACT", Line 4, after "to:" delete "•o".

Column 2, Item (57), under "ABSTRACT", Line 6, after "or" delete "•o".

Column 2, Item (57), under "ABSTRACT", Line 9, after "to:" delete "•o".

Column 2, Item (57), under "ABSTRACT", Line 11, after "or" delete "•o".

In the Specification

In Column 5, Line 8, delete "magnetic sensor." and insert -- magnetic sensor --, therefor.

In Column 18, Clause 1, Line 4, delete "o receive" and insert -- receive --, therefor.

In Column 18, Clause 1, Line 6, delete "o provide" and insert -- provide --, therefor.

In Column 18, Clause 4, Line 20, delete "4" and insert -- 4. --, therefor.

In Column 18, Clause 12, Line 56, delete "12" and insert -- 12. --, therefor.

In Column 19, Clause 15, Line 1, delete "15" and insert -- 15. --, therefor.

In Column 19, Clause 17, Line 8, delete "17" and insert -- 17. --, therefor.

Signed and Sealed this
Twenty-second Day of April, 2025

Coke Morgan Stewart
*Acting Director of the United States Patent and Trademark Office*

CERTIFICATE OF CORRECTION (continued)
U.S. Pat. No. 12,117,739 B2

In Column 19, Clause 18, Lines 11-13, delete "18. The object table according to clause 17, wherein the thermo-mechanical actuator is configured to deform the support surface." and insert the same on Line 12 as a new continuation point.

In Column 19, Clause 19, Line 14, delete "19" and insert -- 19. --, therefor.

In Column 19, Clause 24, Line 31, delete "o a" and insert -- a --, therefor.

In Column 19, Clause 24, Line 32, delete "o a" and insert -- a --, therefor.

In the Claims

In Column 20, Claim 14, Line 45, delete "comprising" and insert -- comprising: --, therefor.

In Column 21, Claim 20, Line 14, delete "comprising" and insert -- comprising: --, therefor.